United States Patent
Dedic et al.

(10) Patent No.: US 11,599,140 B1
(45) Date of Patent: Mar. 7, 2023

(54) DISTRIBUTED VOLTAGE CONTROLLED OSCILLATOR (VCO)

(71) Applicant: Acacia Communications, Inc., Maynard, MA (US)

(72) Inventors: Ian Dedic, London (GB); David Enright, Maldon (GB); Tarun Gupta, Santa Clara, CA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/587,191

(22) Filed: Sep. 30, 2019

(51) Int. Cl.
  *G06F 1/12* (2006.01)
  *H01P 3/06* (2006.01)
  *H03B 5/08* (2006.01)

(52) U.S. Cl.
  CPC .............. *G06F 1/12* (2013.01); *H01P 3/06* (2013.01); *H03B 5/08* (2013.01)

(58) Field of Classification Search
  CPC ........................................... G06F 1/12
  USPC ............................................... 331/46
  See application file for complete search history.

(56) References Cited

U.S. PATENT DOCUMENTS

| | | | |
|---|---|---|---|
| 8,432,229 B2* | 4/2013 | Dong | H03B 5/1265 331/2 |
| 2011/0006850 A1* | 1/2011 | Shibasaki | H03L 7/0805 331/55 |
| 2018/0241346 A1* | 8/2018 | Wu | H03L 7/24 |
| 2019/0280648 A1* | 9/2019 | Chen | H03B 5/1237 |

* cited by examiner

Primary Examiner — Joseph Chang (57) ABSTRACT

In a first and second embodiment, an apparatus and system comprising a set of voltage controlled oscillators (VCOs); wherein each VCO of the set of VCOs has an LC tank; wherein each VCO of the set of VCOs is connected via a transmission line. In a third embodiment, a method comprising connecting each VCO in a set of VCOs by connecting each respective LC tank of each VCO of the set of VCOs with a transmission line.

22 Claims, 9 Drawing Sheets

DISTRIBUTED VOLTAGE CONTROLLED OSCILLATOR (VCO)

BACKGROUND

A clock may be used to provide a timing signal in a digital circuit.

BRIEF DESCRIPTION OF THE FIGURES

Various aspects and embodiments of the application will be described with reference to the following example embodiments. It should be appreciated that the figures are not necessarily drawn to scale.

SUMMARY

In a first and second embodiment, an apparatus and system comprising a set of voltage controlled oscillators (VCOs); wherein each VCO of the set of VCOs has an LC tank; wherein each VCO of the set of VCOs are connected via a transmission line. In a third embodiment, a method comprising connecting a set of voltage controlled oscillators (VCO)s by connecting each respective LC tank of each VCO of the set of VCOs with a transmission line.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal.

In most embodiments, a coherent optical communication system may have high data rates. In almost all embodiments, it may be necessary to divide data received into discrete time intervals. In many embodiments, a clock on a transmitter may determine when a signal is sent out. In some embodiments, an analog to digital converter may determine when samples are taken and converted into a digital format. In many embodiments, in a coherent optical system it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2 pi times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in the wave produced by a voltage-controlled oscillator (VCO).

In some embodiments, there may be 20 picoseconds between transmitted or received data samples. In certain embodiments, a clock may be used to denote the time between samples. In many embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may beneficial to be able to generate and distribute a clock signal without dissipating power and keeping jitter to a minimum.

In many embodiments, a clock may need to provide a signal to denote a sampling time. In certain embodiments, a clock may need to be distributed to a number of different locations performing a conversion of a signal. In most embodiments, it may require power to distribute a clock to different locations or circuits that use the clock. In further embodiments, it may require power to drive or distribute a clock.

In many embodiments, a clock may be a voltage-controlled oscillator (VCO). In certain embodiments, a VCO may be a ring oscillator. Typically, a ring oscillator may be used as a clock for a digital signal processor (DSP). In other embodiments, a VCO may have a resonance tank or tank. In some embodiments, a tank may be formed by a resonance circuit with an inductor (L) and a capacitor (C).

In many embodiments, an LC tank type VCO may be used to provide a clock for an ADC or DAC. In some embodiments, Applicants have realized that ring oscillators may be used at lower frequencies and are able to drive a higher load. In most embodiments, Applicants have realized that a ring oscillator may not be able to function efficiently at higher frequencies or when higher speed conversions are necessary, such as those required in an ADC or DAC of optical communications. In certain embodiments, it may not be possible to use a ring oscillator VCO at higher frequencies as the delay around the ring cannot be made small enough. In most embodiments, Applicants have realized it may be beneficial to use an LC tank type VCO to enable a clock that operates at higher frequencies. Conventionally, ring oscillators require much higher power consumption than LC oscillators for the same level of phase noise/jitter.

In certain embodiments, with an LC tank VCO, energy in the tank may flow between the L and the C at a given phase. In many embodiments, phase of a flow of energy around a tank of a VCO may denote a clock cycle. In most embodiments, tanks are referred to as having a Q ratio. In many embodiments, Q refers to the ratio between energy circulating around a tank and the amount of energy that is lost each time the energy flows around the tank. In most embodiments, a tank with a higher Q ratio is preferable as higher Q indicates lower energy loss for each clock cycle.

In many embodiments, it may be beneficial to generate a clock, buffer it, and distribute the clock signal using low power while limiting the amount of jitter in the clock signal. Typically, to distribute a clock signal to multiple circuits or locations, it may be necessary to buffer the clock signal. Generally, each time you add a buffer, it may be necessary to add more power. Conventionally, a buffer adds noise and jitter into a system as it is an analog component. Usually, adding a buffer to a VCO may add to a load of the VCO. In most embodiments, an ideal buffer may have no input load, no output capacitance, and output Q to be low.

Generally, a single VCO might be used as a clock, connected to a series of buffers, where the series of buffers distribute the VCO clock to a number of macros. Conventionally, a clock path may have needed to distribute the clock over hundreds of micrometers or many millimeters. Typically, each buffer in a clock path increases the power consumption for the clock, increases skew, and increases jitter. In many embodiments, the current disclosure has realized to minimize power and improve jitter, it may be beneficial to minimize a number of buffers used to distribute the clock while keeping the VCO driving a small capacitance to not impact power and jitter constraints.

In certain embodiments, the current disclosure may enable distribution of a VCO clock signal without needing multiple buffers. In many embodiments, the current disclosure may create a unified VCO by connecting inductors of multiple VCO LC tanks using a low resistance coaxial line along across the physical width of one or more converters. In some embodiments, the current disclosure may transform multiple VCOs into a single distributed VCO through the use of a connecting coaxial line. In many embodiments, a load of lateral clock distribution, which may be 1.5 mm wide, may be absorbed by an LC tank of a VCO and may not consume any additional power. In many embodiments, a coaxial line may act to tie together different VCOs to form a distributed VCO. In most embodiment, most resonating current may flows between an L and a C of a tank circuit in each VCO of a set of VCOs and a much smaller current may flow along a connection line, where the loss to the connection line may be so low it has little to no effect.

In some embodiments, a coaxial line connecting VCOs to form a distributed VCO may have low loss to not degrade VCO quality factor or increase power consumption for the distributed VCO. In many embodiments, a low capacitance transmission line may short internal switching nodes of VCOs together. In some embodiments, a low capacitance may be on an order of 10 fF. In other embodiments, a low capacitance may be a capacitance that is an order of magnitude lower than a capacitive load needed to drive a clock or VCO. In most embodiments, internal switching nodes of a VCO may be nodes of an LC tank. In almost all embodiments, a node may be a connection between two elements or components of a circuit. In certain embodiments, each VCO tank of a distributed VCO may have high swing to get better phase noise. In many embodiments, as a VCO output directly drives local buffer in a converter, it may ease requirement on gain of buffers otherwise required if clock buffering instead of VCO is used for clock distribution. In some embodiments, connecting multiple VCOs in parallel may reduce noise from bias/other circuitry by providing lower phase noise, which may be critical for high speed converters.

In some embodiments, with a distributed VCO, each VCO may be connected to a circuit or multiple circuits and connected to each other through a low capacitance transmission line. In certain embodiments, VCO switching core nodes, or nodes of an LC tank, may be connected together using a low loss transmission line. In certain embodiments, control voltages and internal bias nodes of VCOs may be connected together. In most embodiments, each VCO may only have to drive an input capacitance of a single macro and a small section of the transmission line. In most embodiments, with a distributed set of VCOs, each macro input capacitance may be comparable to a conventional load capacitance of a single buffer. In certain embodiments, usage of a distributed set of VCOs may reduce the individual capacitance driven by each VCO as compared to a single VCO connected to a series of buffers. In many embodiments, a VCO driving lower capacitance may reduce jitter. In many embodiments, a low loss transmission line may be used to synchronize VCOs and may not require each VCO to drive large currents to the neighboring VCO along the transmission line or coax.

In most embodiments, a low loss transmission line may be connected to an LC tank node of a VCO and may connect multiple VCOs in parallel. In almost all embodiments, use of a transmission line to synchronize VCOs may lower the noise of the distributed VCOs due to correlation effects (noise_reduction=10*log 10(No VCO's)), so 2 VCO's in parallel may reduce the noise by 3 dB and 4 VCO's may reduce the noise by 6 dB. In many embodiments, more macros placed in parallel may lower the overall noise of the distributed VCO output. In certain embodiments, power consumption of a VCO per macro, of a distributed VCO, may be lower than a single VCO and buffer tree. In other embodiments, another macro may not require a clock tree to be redesigned as each VCO is designed to drive a single macro and 1 section of coax.

In most embodiments, with use of a common transmission line clock distribution to circuit or macro may require no or almost no additional power. In many embodiments, use of a connecting common transmission line may eliminate the need for additional buffers. In certain embodiments, a common transmission line capacitance of the line may be become part of the capacitance of the oscillator.

In other embodiments, a connecting line between VCOs may be not be coaxial. In certain embodiments, a connecting line may be a stripline or microstrip. In further embodiments, a connecting line between VCOs may be wires with equal lengths (with equal capacitance) connected to each VCO. In most embodiments, no significant current may flow along a connecting line from one VCO to another, except a small current needed to keep the VCOs locked together in the presence of small mismatches between the VCOs.

In a particular embodiment, with 4 VCOs separated by L, where L represents the length of the connecting line, there are be L/2 "stubs" at the VCOs at the end of a connection, so each VCO sees a total wire load of L. The VCOs at the end have a load of L/2 on each side (the stubs being L/2 and half of the L shared with another VCO). The VCOs in the middle have L/2 at each side as they share the L with another VCO resulting in L/2.

In almost all embodiments, a transmission line may keep VCOs connected by the line locked together with the same amplitude and phase in each LC tank of each VCO. In most embodiments, if there is anything which would tend to make VCOs different in amplitude or phase (e.g. device mismatches) then some current may flow along connecting wires (or transmission lines) to correct this and match the VCOs.

In many embodiments, a circuit may need multiple clock inputs with a synchronized clock. In other embodiments, multiple circuits may need inputs from a synchronized clock. In certain embodiments, a digital to analog converter circuit may need a low skew clock signal to be available across an entire width of the layout. In other embodiments, a circuit may have multiple building blocks, such as for different bits or segments, each of which may need an identical clock. In a particular embodiment, an 8 bit DAC may have 12 slices, 7 identical ones (each a value of ⅛) to provide 3 MSBs and 5 binary weighted ones (1/16, 1/32, 1/64, 1/128, and 1/256). In certain embodiments, a single clock input to a DAC may require a zero-skew 1-12 clock tree inside the DAC, which may be difficult in layouts an may add capacitance. In alternative embodiments, if there are 2 1 to 6 trees, then two clock inputs may be used to reduce complexity where each clock provides a signal to a tree. In certain embodiments, multiple clock signals may be needed for different circuits, such as an I circuit and a Q circuit that controls I and Q components. In other embodiments, multiple clock inputs may be used to drive a phased array of antennas which may spread across to multiple DACs across a chip.

Figure 1:
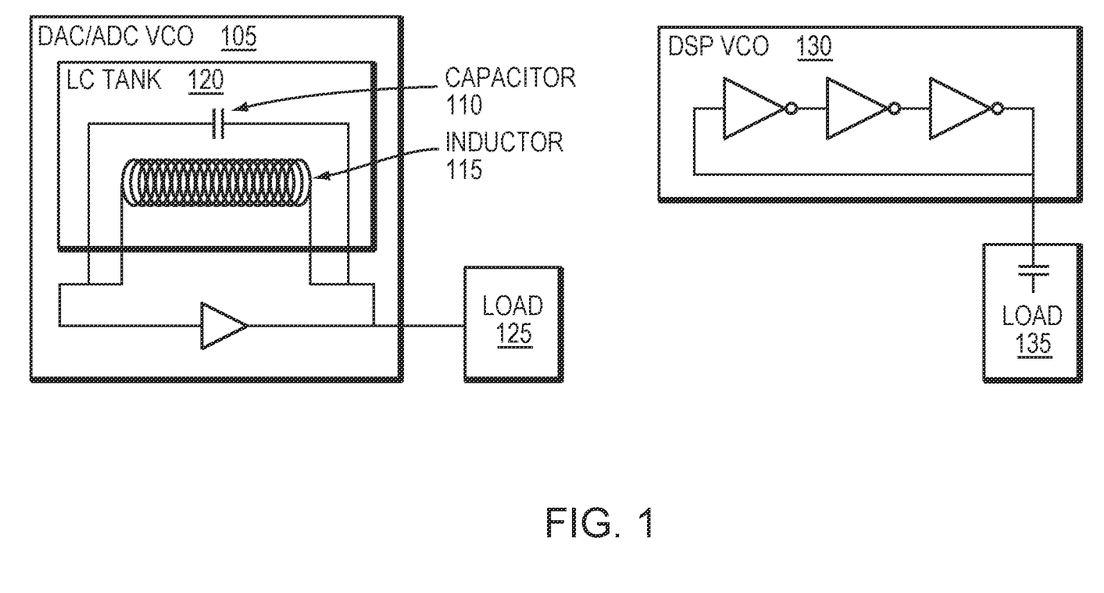
FIG. 1 is a simplified illustration of an LC tank VCO, in accordance with an embodiment of the present disclosure.

Refer now to the example embodiment of FIG. 1, which illustrates two types of voltage controlled oscillators. DAC/ADC VCO 105 is an LC Tank VCO oscillator. DAC/ADC VCO 105 has capacitor 110 and inductor 115 which make up LC Tank 120. The clock signal of DAC/ADC VCO occurs when current flows from capacitor 110 to inductor 115. VCO 105 is also connected to load 125. DSP VCO 130 is a ring type oscillator connected to load 135.

Figure 2:
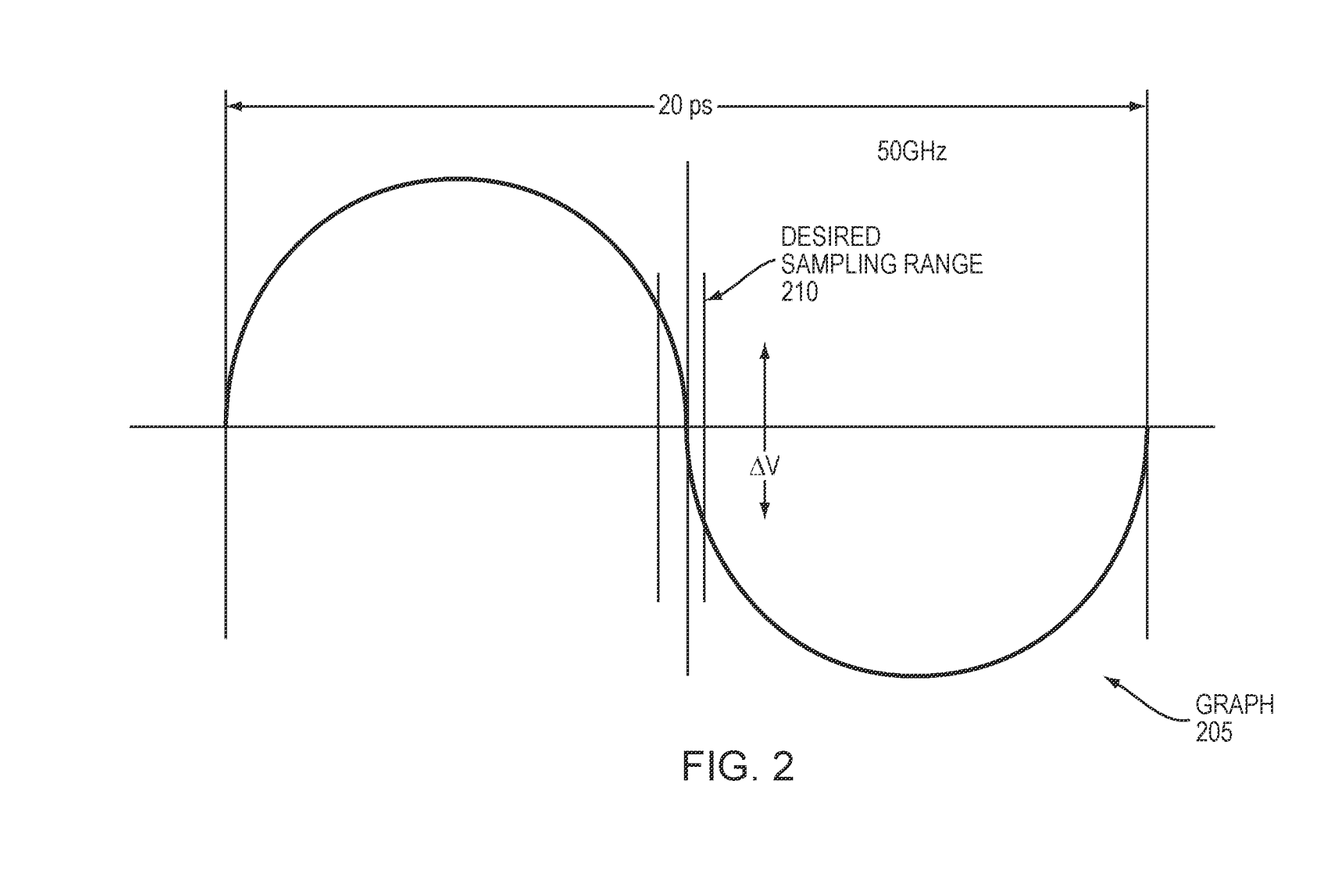
FIG. 2 is a simplified illustration sampling a signal, in accordance with an embodiment of the present disclosure.

Refer now to the example embodiment of FIG. 2. Graph 205 of figure two illustrates a signal of 20 pico seconds running at 50 GHz. Desired sampling range 210 illustrates where during the sample that a reading should be taken. If a sample is taken outside of desired sampling range 210, such as because of clock jitter, then a voltage error may be introduced into a reading. Thus, in this embodiment it is desirable to get a clock that enables sampling with desired sampling range 210, has little or no jitter, and requires low amounts of power to drive and distribute the clock.

Figure 3:
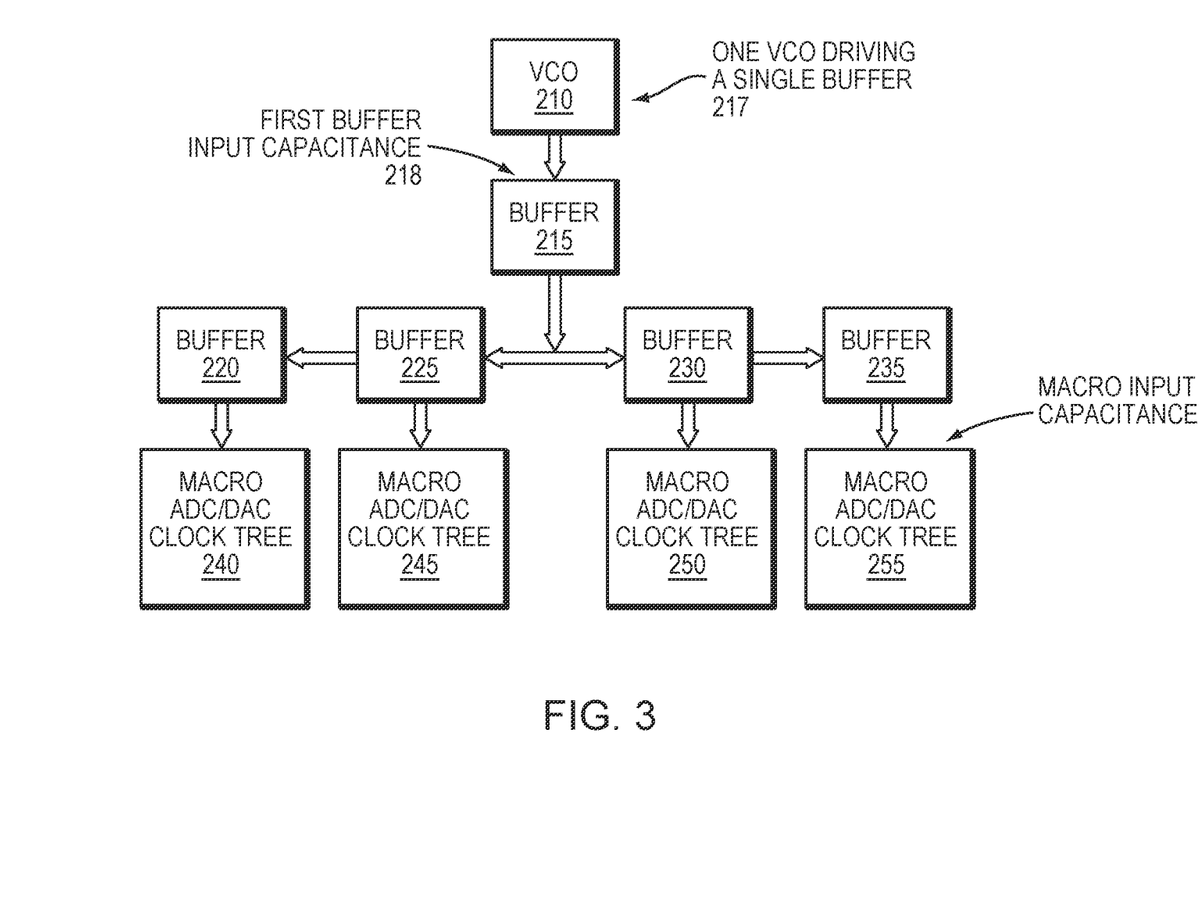
FIG. 3 is a simplified illustration of a VCO being distributed to circuits using buffers, in accordance with an embodiment of the present disclosure.

Refer now to the example embodiment of FIG. 3, which illustrates a single VCO driving a set of macros or circuits using buffers. VCO 210 is connected to buffer 215. In this example embodiment, VCO 210 is driving single buffer 215. First input buffer 215 has input capacitance 218. Buffer 215 in turn connects to buffers 220, 225, 230, and 235. Each of these buffers 220, 225, 230, and 235, respectively drives a macro ADC/DAC clock tree such as ADC/DAC clock trees 240, 245, 250, and 255. In this example embodiment, Applicants have realized that a number of buffers are needed to end the clock signal to each macro. In this embodiment, each buffer requires more power resulting in power requirements to both generate and distribute the clock. In this embodiment, Applicants have realized it would be beneficial to have a VCO system that eliminated the need for buffers and additional power requirements.

Figure 4A:
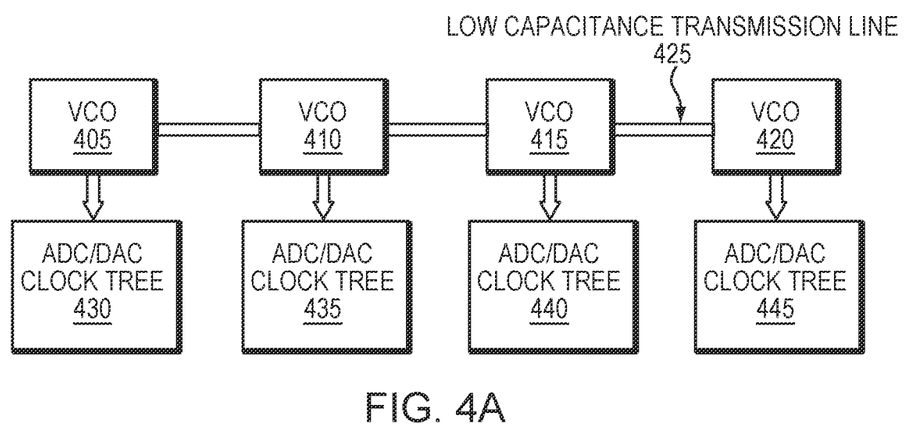
FIG. 4a is a simplified illustration of a distributed VCO, in accordance with an embodiment of the present disclosure.
Figure 4B:
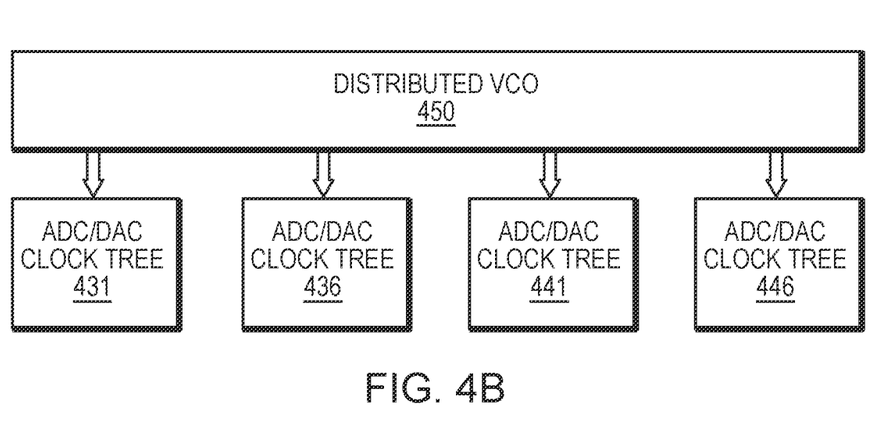
FIG. 4b is a simplified alternative illustration of a distributed VCO, in accordance with an embodiment of the present disclosure.

Refer now to the example embodiment of FIG. 4a. In the example embodiment of 4a, VCOs 405, 410, 415, and 420 are connected by low capacitance transmission line 425 which shorts the internal switching nodes of the VCOs together. By shorting the internal switching nodes of VCOs 405, 410, 415, and 420 any difference between the VCOs clocks is eliminated, synchronizing the clocks of each VCO to the same time. A portion of the load of low capacitance transmission line 425 is absorbed by each VCO adding little additional load to each VCO. Each VCO of VCOs 405, 410, 415, and 420, respectively, is connected to an ADC/DAC clock tree such as ADC/DAC clock trees 430, 435, 440, and 445. Referring now as well to FIG. 4b, VCOs 405, 410, 415, and 420 and low capacitance transmission line 425 may be viewed as a single distributed VCO 450 as the clock signal from each VCO distributed to each macro or clock tree is the same.

Figure 5:
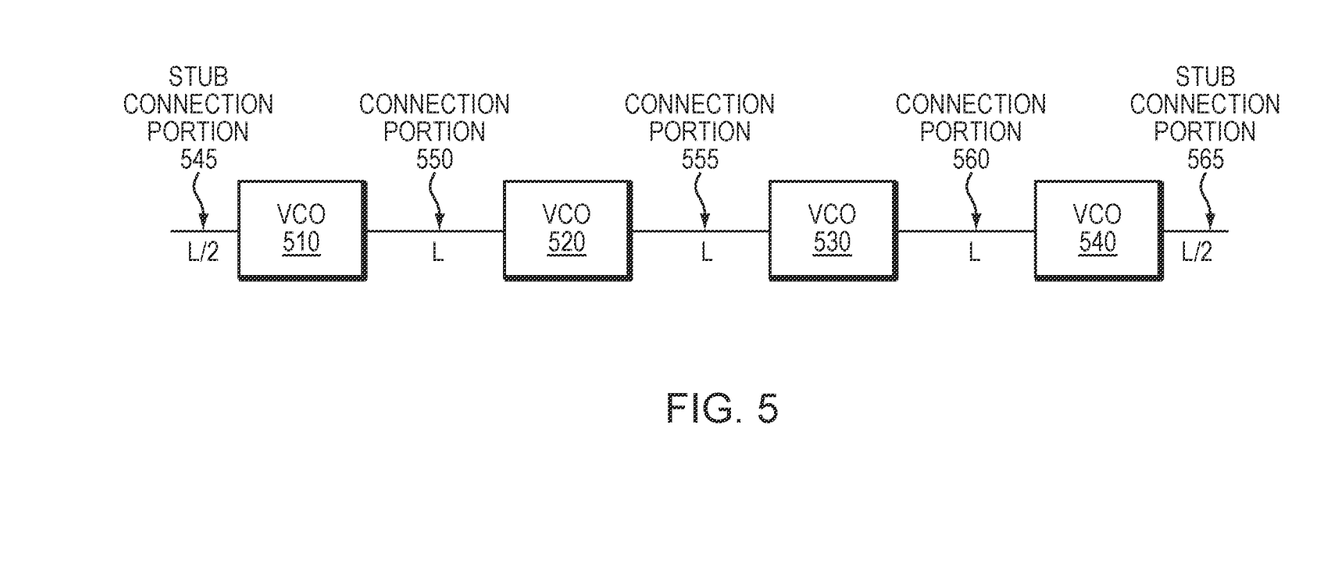
FIG. 5 is a simplified further illustration of a distributed VCO, in accordance with an embodiment of the present disclosure.

Refer now to the example embodiment of FIG. 5. In the example embodiment of FIG. 5, a set of VCOs are connected by a connective line. VCO 510, VCO 520, VCO 530, and VCO 540 are connected by a transmission line made up of connection portions 550, 555, and 560. Each connection portion has a value of L. As well, VCO 510 has stub portion 545 and VCO 540 has stub portion 565. This means that each VCO has two connections, each with a value of L/2. For example, VCO 510 has connection portion 545 at L/2 and half of connection portion 550 with a value of L. Connection portion 550 has a value of L, which is divided to give VCO 510 L/2 and VCO 520 L/2. Stub portion 545 and stub portion 565 ensure that the load on each VCO is the same and provides to VCO 510 and VCO 540 an additional L/2 value as VCO 510 and VCO 540 are not connected to further VCOs. In this embodiment, the transmission line VCO 510, VCO 520, VCO 530, and VCO 540 locked together with the same amplitude and phase in each LC tank; where any differences between the VCOs would be equalized by current flows along transmission line.

Figure 6:
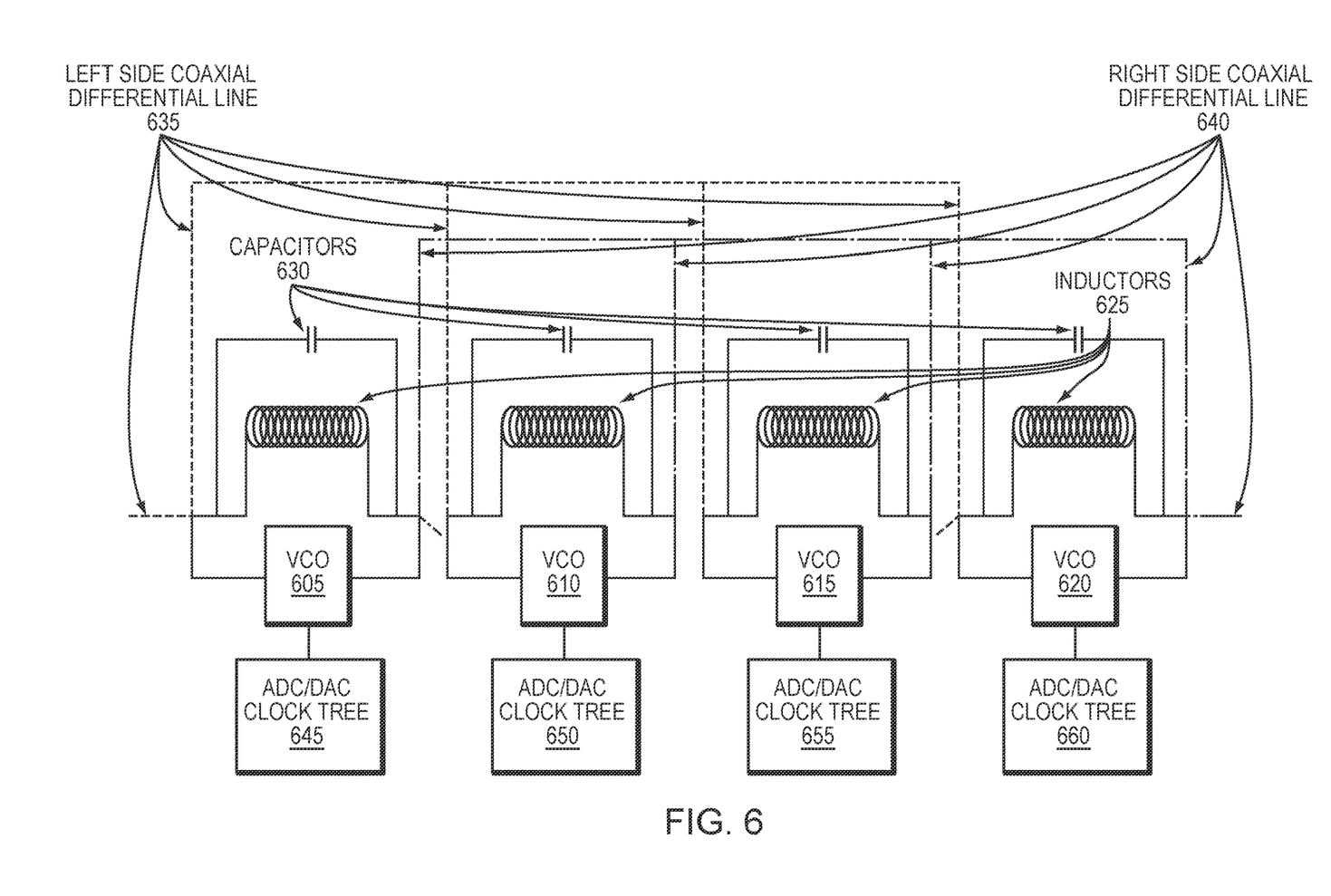
FIG. 6 is a simplified illustration of a distributed VCO driving a set of circuits, in accordance with an embodiment of the present disclosure.

Refer now to the example embodiment of FIG. 6, which illustrates an embodiment of VCOs connected by a coaxial differential line. In FIG. 6, VCOs 605, 610, 615, and 620 have capacitors 630 and inductors 625. The nodes of capacitors 630 and inductors 625 are connected by left side coaxial differential line 635 on the left side node and by right side coaxial differential line 640 on the right side node. Each VCO of VCOs 605, 610, 615, and 620, respectively, is connected to an ADC/DAC clock tree such as ADC/DAC clock tree 645, 650, 655, and 660 respectively. In this example embodiment end VCO 605 and end VCO 620 each have two end stubs as these VCOs are connected to another VCO on only one side. In this example embodiment, left side coaxial differential line 635 and right side coaxial differential line 640 keep the clock of each VCO synchronized. The clock signal received by each ADC/DAC clock tree 645, 650, 655, and 660 is the same clock signal.

Figure 7:
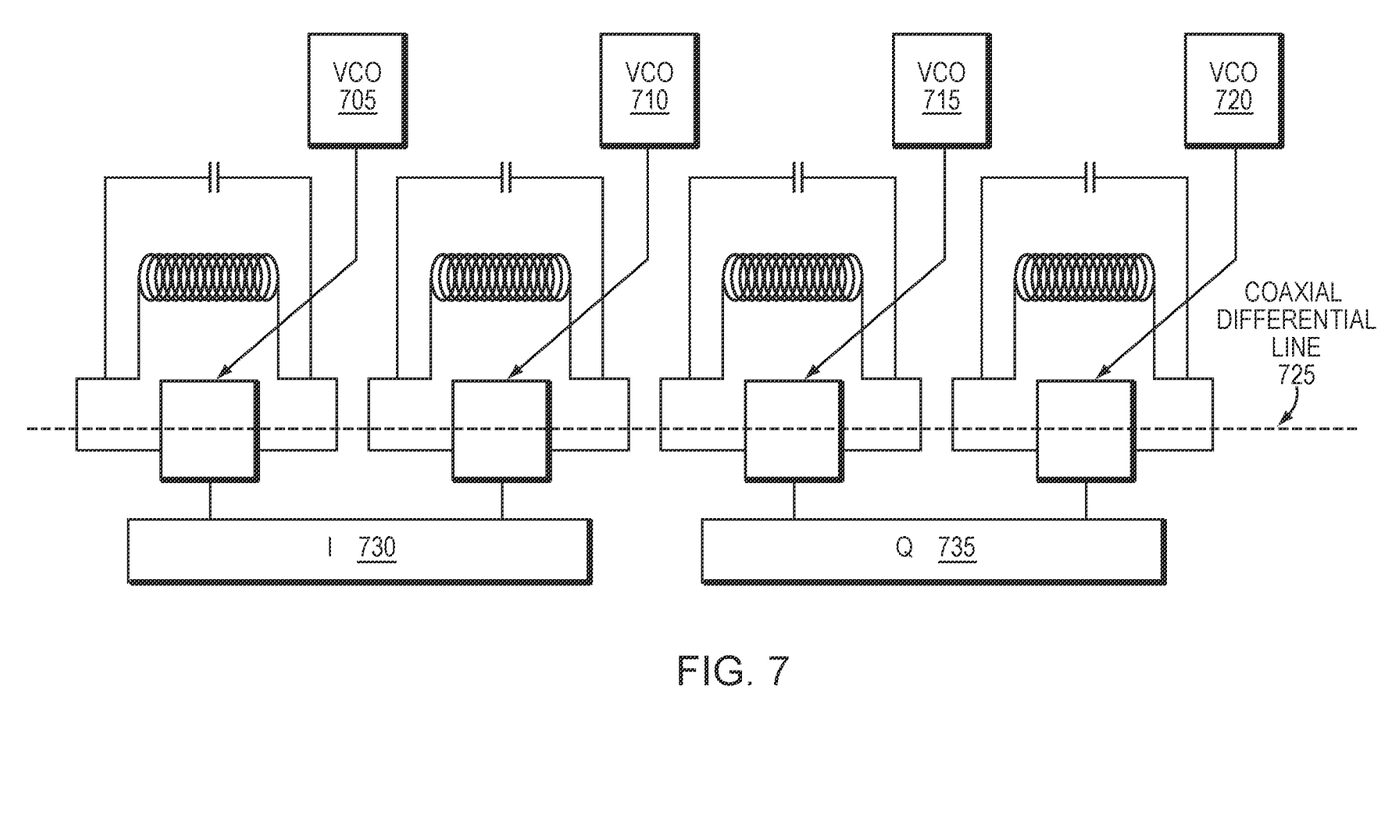
FIG. 7 is a simplified further illustration of a distributed VCO with multiple VCOs connected to respective circuits with multiple clock inputs, in accordance with an embodiment of the present disclosure.

Refer now to the example embodiment of FIG. 7, which illustrates VCOs driving an I and Q signal. VCOs 705 and 710 are connected to I 730. VCOs 715 and 720 are connected to Q 735. VCOs 705, 710, 715, and 720 are connected to each other by coaxial differential line 725. Coaxial line 725 synchronizes the clock of each VCO of VCOs 705, 710, 715, and 720. In this embodiment, I 730 is a circuit with two clock inputs and Q 735 is a circuit with two clock inputs. In this example embodiment, two VCOs drive a single respective circuit with two clock inputs. In further embodiments, there may be different numbers of circuits and each circuit may have different numbers of inputs. In some embodiments, one circuit of a set of circuits may have three inputs and other circuits may have one input. In certain embodiments, one circuit may have a single input, another circuit may have two inputs, and a third circuit may have three inputs. In still further embodiments, other combinations of clock input to circuits may be possible. In almost all embodiments, a transmission line may synchronize a clock signal across all circuits linked to VCO.

Figure 8:
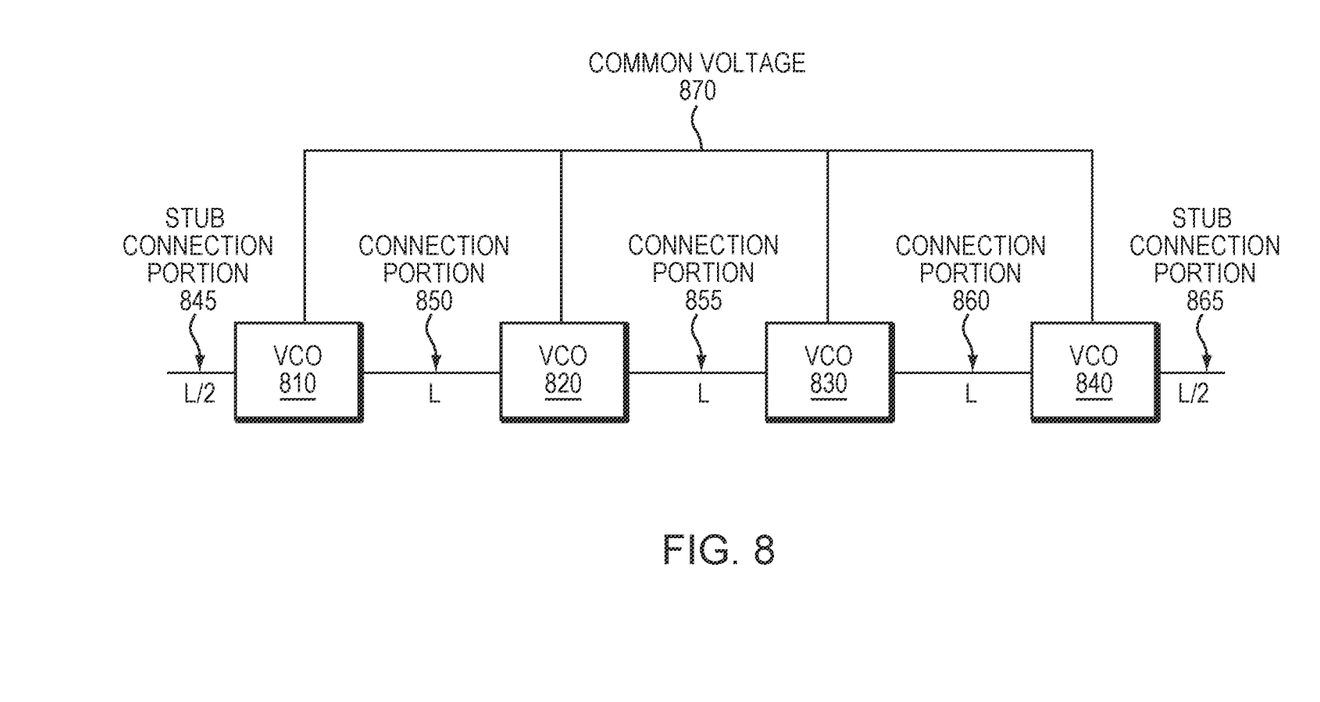
FIG. 8 is a simplified further illustration of a distributed VCO with control voltages connected together, in accordance with an embodiment of the present disclosure.

Refer now to the example embodiment of FIG. 8. In the example embodiment of FIG. 8, a set of VCOs are connected by a connective line. VCO 810, VCO 820, VCO 830, and VCO 840 are connected by a transmission line made up of connection portions 850, 855, and 860. Each connection portion has a value of L. As well, VCO 810 has stub portion 845 and VCO 840 has stub portion 865. This means that each VCO has two connections, each with a value of L/2. For example, VCO 810 has connection portion 845 at L/2 and half of connection portion 850 with a value of L. Connection portion 850 has a value of L, which is divided to give VCO 810 L/2 and VCO 820 L/2. Stub portion 845 and stub portion 865 ensure that the load on each VCO is the same and provides to VCO 810 and VCO 840 an additional L/2 value as VCO 810 and VCO 840 are not connected to further VCOs. In this embodiment, the transmission line VCO 810, VCO 820, VCO 830, and VCO 840 locked together with the same amplitude and phase in each LC tank; where any differences between the VCOs would be equalized by current flows along transmission line. Common voltage 870 is connected to VCO 810, VCO 820, VCO 830, and VCO 840.

Figure 9:
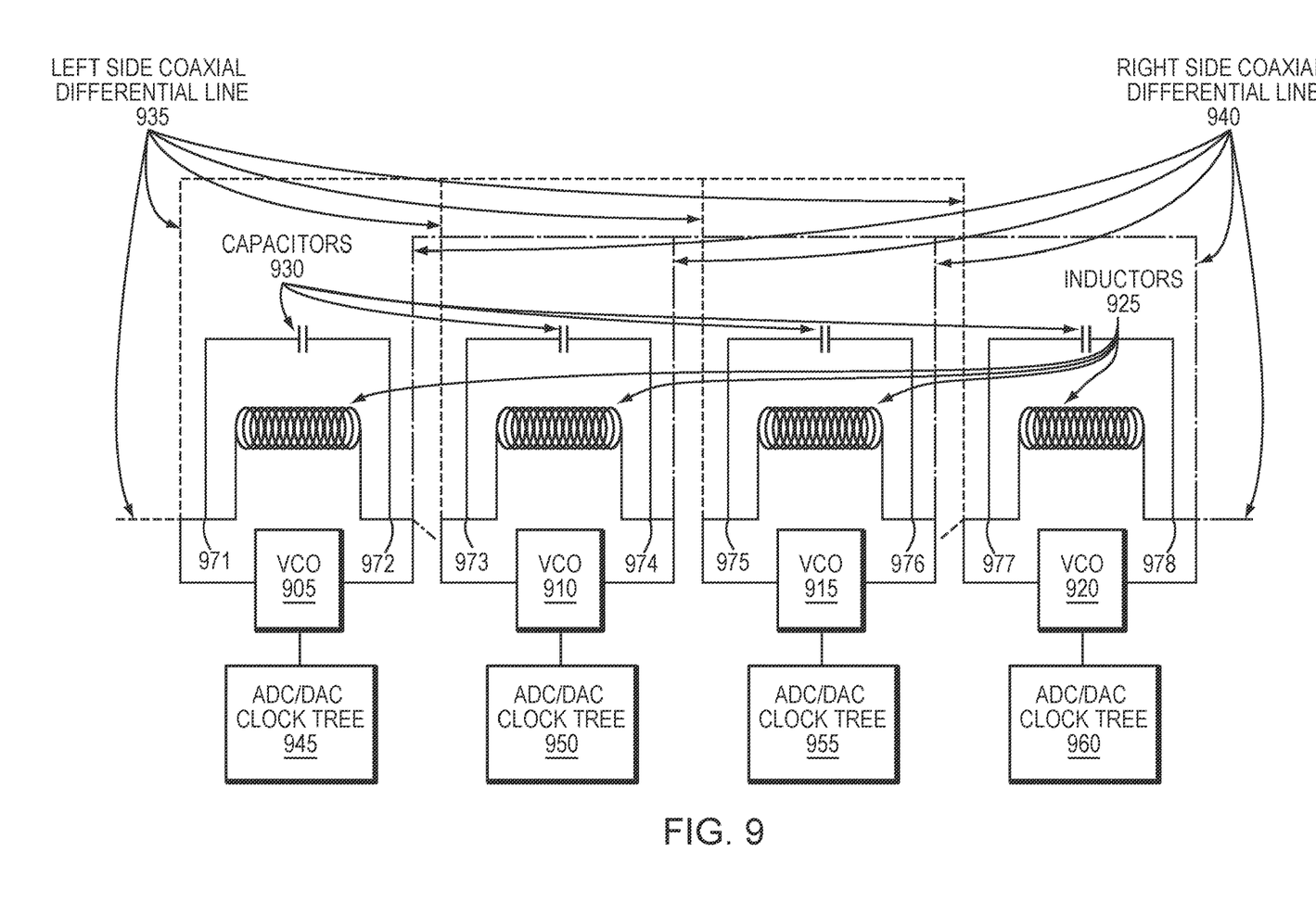
FIG. 9 is an alternative embodiment of a simplified illustration of a distributed VCO driving a set of circuits, in accordance with an embodiment of the present disclosure.

Refer now to the example embodiment of FIG. 9, which illustrates an embodiment of VCOs connected by a coaxial differential line. In FIG. 9, VCOs 905, 910, 915, and 920 have capacitors 930 and inductors 925. The nodes of capacitors 930 and inductors 925 are connected by left side coaxial differential line 935 on the left side node and by right side coaxial differential line 940 on the right side node. Each VCO of VCOs 905, 910, 915, and 920, respectively, is connected to an ADC/DAC clock tree such as ADC/DAC clock tree 945, 950, 955, and 960 respectively. In this example embodiment end VCO 905 and end VCO 920 each have two end stubs as these VCOs are connected to another VCO on only one side. In this example embodiment, left side coaxial differential line 935 and right side coaxial differential line 940 keep the clock of each VCO synchronized. The clock signal received by each ADC/DAC clock tree 945, 950, 955, and 960 is the same clock signal. Internal bias node 972 is connected to internal bias node 974, which is connected to internal bias note 976, which is connected to internal bias node 978 through right side coaxial differential line 940. Internal bias node 971 is connected to internal bias node 973, which is connected to internal bias node 975, which is connected to internal bias node 977 through left side coaxial differential line 935.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:
1. An apparatus comprising:
   a set of voltage controlled oscillators (VCOs); wherein each VCO of the set of VCOs has an LC tank; wherein the LC tank comprises an inductor and a capacitor connected in a resonance circuit; wherein none of the VCOs of the set of VCOs has an input clock; wherein each VCO of the set of VCOs is connected to a common voltage that controls a frequency of each VCO of the VCOs; wherein each LC tank of each VCO of the set of VCOs are connected via a transmission line to minimize skew between each VCO of the set of VCOs; wherein connecting each VCO to the set of VCOs via the transmission line minimizes additional power consumption.

2. The apparatus of claim 1 wherein the transmission line has a low capacitance.

3. The apparatus of claim 2 wherein each VCO of the set of VCOs drives a portion of the transmission line.

4. The apparatus of claim 1 wherein each VCO of the set of VCOs functions as a clock; wherein the transmission line synchronizes each clock of each VCO of the set of VCOs.

5. The apparatus of claim 1 wherein each VCO of the set of VCOs is connected to provide a clock signal to a separate circuit.

6. The apparatus of claim 1 wherein each VCO of the set of VCOs is connected to one circuit with several clock input ports.

7. The apparatus of claim 1 wherein each VCO of the set of VCOs is connected to an input port of one of several circuits each with several clock input ports.

8. The apparatus of claim 1 wherein the transmission line is connected to nodes of the LC tank of each VCO of the set of VCO; wherein the inductor and the capacitor of the LC tank are connected in parallel.

9. The apparatus of claim 1 wherein the set of VCOs has internal bias nodes; wherein the internal bias nodes of the VCOs are connected together.

10. A method comprising:
connecting each VCO in a set of voltage controlled oscillators (VCOs) to minimize skew between each VCO of the set of VCOs; wherein the connecting includes:
connecting a common voltage to each VCO of the set of VCOs; wherein the common voltage controls a frequency of each VCO of the VCOs to keep each VCO at the same frequency; wherein none of the VCOs of the set of VCOs has an input clock; and
connecting each respective LC tank of each VCO of the set of VCOs with a transmission line wherein each respective LC tank comprises an inductor and a capacitor connected in a resonance circuit.

11. The method of claim 10 wherein the connecting connects the transmission line to nodes of each respective LC tank of the set of VCOs; wherein the inductor and the capacitor of the LC tank are connected in parallel.

12. The method of claim 11 wherein each VCO of the set of VCOs functions as a clock; wherein the transmission line synchronizes each clock of each VCO of the set of VCOs.

13. The method of claim 12 wherein each VCO of the set of VCOs drives a portion of the transmission line.

14. The method of claim 10 further comprising
connecting internal bias nodes of the VCOs of the set of VCOs.

15. A system comprising:
a set of voltage controlled oscillators (VCOs); wherein each VCO of the set of VCOs has an LC tank; wherein the LC tank comprises an inductor and a capacitor connected in a resonance circuit;
a common voltage connected to each VCO of the set of VCOs; wherein the common control voltage controls a frequency of each VCO of the VCOs; wherein none of the VCOs of the set of VCOs has an input clock; and
a transmission line; wherein each LC tank of each VCO of the set of VCOs is connected via the transmission line to minimize skew between each VCO of the set of VCOs.

16. The system of claim 15 wherein the transmission line is connected to nodes of each LC tank of each VCO of the set of VCOs; wherein the inductor and the capacitor of the LC tank are connected in parallel.

17. The system of claim 16 wherein the transmission line has a low capacitance.

18. The system of claim 16 wherein each VCO of the set of VCOs drives a portion of the transmission line.

19. The system of claim 16 wherein each VCO of the set of VCOs functions as a clock; wherein the transmission line synchronizes each clock of each VCO of the set of VCOs.

20. The system of claim 16 further comprising:
a set of circuits; wherein each VCO of the set of VCOs is connected to a respective circuit of the set of circuits; wherein each VCO of the set of VCOs provides a clock signal to a respective circuit of the set of circuits.

21. The system of claim 16 further comprising:
a set of circuits; wherein each circuit has multiple clock inputs; wherein multiple respective VCOs of the set of VCOs are connected to each multiple clock input signal of a respective circuit of the set of circuits.

22. The system of claim 15 wherein the set of VCOs has internal bias nodes; wherein the internal bias nodes of the VCOs are connected together.

* * * * *